United States Patent
Lai et al.

(10) Patent No.: US 6,815,722 B2
(45) Date of Patent: Nov. 9, 2004

(54) LIGHT-EMITTING DEVICE WITH REDUCED LATTICE MISMATCH

(75) Inventors: Mu-Jen Lai, Jungli (TW); Chiung-Yu Chang, Hsinchu (TW)

(73) Assignee: Vetra Technology, Inc., Hsinchu (TW)

( * ) Notice: Subject to any disclaimer, the term of this patent is extended or adjusted under 35 U.S.C. 154(b) by 56 days.

(21) Appl. No.: 10/601,957

(22) Filed: Jun. 23, 2003

(65) Prior Publication Data

US 2004/0113155 A1 Jun. 17, 2004

(30) Foreign Application Priority Data

Dec. 13, 2002 (TW) .......................................... 91136160 A

(51) Int. Cl.$^7$ ............................................. H01L 27/15
(52) U.S. Cl. ......................................... 257/79; 257/190
(58) Field of Search .......................... 257/79, 190, 191, 257/94, 96, 97, 103, 615, 77, 201

(56) References Cited

U.S. PATENT DOCUMENTS 5,679,152 A * 10/1997 Tischler et al. ................ 117/97
6,630,695 B2 * 10/2003 Chen et al. .................. 257/190

* cited by examiner

Primary Examiner—Mark V. Prenty
(74) Attorney, Agent, or Firm—Thomas, Kayden, Horstemeyer & Risley

(57) ABSTRACT

A light-emitting device with reduced lattice mismatch. The light-emitting device comprises a substrate having a first lattice constant, a first buffer multilayer deposited on the substrate, a second buffer multilayer deposited on the first buffer multilayer, and a GaN base epitaxial layer deposited on the second buffer multilayer. The lattice constant of the first buffer multilayer ranges from the first lattice constant at the bottom of the first buffer multilayer to a second lattice constant at the top of the first buffer multilayer. The lattice constant of the second buffer multilayer ranges from the second lattice constant at the bottom of the second buffer multilayer to a third lattice constant at the top of the second buffer multilayer.

9 Claims, 2 Drawing Sheets

LIGHT-EMITTING DEVICE WITH REDUCED LATTICE MISMATCH

BACKGROUND OF THE INVENTION

1. Field of the Invention

The present invention relates to a light-emitting device and in particular to a light-emitting device comprising buffer multilayers of gradual lattice constants to reduce lattice mismatch in the joint of layers.

2. Description of the Related Art

Generally, light-emitting devices comprise light emitting and laser diodes. A group-III nitride semiconductor light-emitting diode is fabricated by providing an electrode on a stacked layer structure having a pn-junction type light-emitting part comprising, for example, aluminum gallium indium nitride ($Al_xGa_yIn_{1-x-y}N$, where $0<x$, $y<1$ and $0<x+y<1$). The lattice constant of the group-III nitride semiconductor layer is different from that of the substrate.

In the stacked layer structure, a buffer layer is generally provided to reduce lattice mismatch between the substrate material and the group-III nitride semiconductor layer constituting the stacked layer structure, thereby forming a high-quality group-III nitride semiconductor layer. Conventionally, for example, in the stacked layer structure for use in a light-emitting device using a sapphire ($\alpha$-$Al_2O_3$ single crystal) substrate, the buffer layer is exclusively composed of aluminum gallium nitride (compositional formula; $Al_\alpha Ga_\beta N$, where $0 \leq \alpha$, $\beta \leq 1$).

In FIG. 1, a conventional light-emitting device having a buffer layer is shown. The light-emitting device 10 comprises sapphire as a substrate 100. The stacked layers are formed on the c {0001} plane of the sapphire substrate 100. The stacked layers comprise a buffer layer 102, a first group-III nitride semiconductor layer 104, a first cladding layer 106 consisting of a hexagonal GaN, an active layer 108 consisting of a GaN-based semiconductor layer, a second cladding layer 110, and a second group-III nitride semiconductor layer 112. The buffer layer 102 relaxing lattice mismatch between the substrate and the following stacked layer usually consists of GaN. A first type electrode 116 is deposited on the first group-III nitride semiconductor layer 104, doped with the same conductive type as the first type electrode 116. A second type electrode 114 is deposited on the second group-III nitride semiconductor layer 112, doped with the same conductive type as the first type electrode 114.

However, lattice mismatch between the sapphire substrate and the group-III nitride semiconductor layer is still high (about 13.8%), causing defects in the stacked layer. Lifetime is shortened and light-emitting efficiency is decreased thereby, making it necessary to solve the lattice mismatch.

SUMMARY OF THE INVENTION

Accordingly, an object of the invention is to provide a light-emitting device with reduced lattice mismatch, thereby improving light-emitting efficiency.

One feature of the present invention is use of a buffer multilayer comprising a first buffer multilayer, such as $B_xGa_{(1-x)}P$, and a second buffer multilayer, such as $In_yGa_{(1-y)}N$. The buffer multilayer is deposited between the substrate and the first cladding layer. The lattice constant of the bottom layer of the first buffer multilayer is substantially equal to the lattice constant of the substrate. As well, the lattice constant of the first buffer multilayer can increase or decrease layer by layer, enabling the lattice constant of the top layer of the first buffer multilayer to substantially equal that of the bottom of the second buffer multilayer.

Another feature of the present invention is the second buffer multilayer being deposited between the first buffer multilayer and the first cladding layer. The lattice constant of the bottom layer of the second buffer multilayer is substantially equal to the lattice constant of the top layer of the first buffer multilayer. As well, the lattice constant of the second buffer multilayer can increase or decrease layer by layer, enabling the lattice constant of the top layer of the second buffer multilayer to substantially equal that of the first cladding layer.

To achieve the above objects, one aspect of the present invention provides a light-emitting device with reduced lattice mismatch. The light-emitting device comprises a substrate having a first lattice constant, a first buffer multilayer deposited on the substrate, a second buffer multilayer deposited on the first buffer multilayer, and a GaN base epitaxial layer deposited on the second buffer multilayer. The lattice constant of the first buffer multilayer ranges from a first lattice constant at the bottom of the first buffer multilayer to a second lattice constant at the top of the first buffer multilayer. The lattice constant of the second buffer multilayer ranges from a second lattice constant at the bottom of the second buffer multilayer to a third lattice constant at the top of the second buffer multilayer.

According to the present invention, the substrate comprises silicon. Moreover, the first buffer multilayer is represented by general formula $B_xGa_{(1-x)}P$ (where $0.02 \leq x \leq 1$). Furthermore, the second buffer multilayer is represented by general formula $In_yGa_{(1-y)}N$ (where $0 \leq y \leq 0.059$). Thus, the first lattice constant is about 5.431 Å. The second lattice constant is about 4.538 Å. The third lattice constant is about 4.51 Å.

According to the present invention, the substrate comprises 3C—SiC. Moreover, the first buffer multilayer is represented by general formula $B_xGa_{(1-x)}P$ (where $x=1$). Furthermore, the second buffer multilayer is represented by general formula $In_yGa_{(1-y)}N$ (where $0 \leq y \leq 0.059$). Therefore, the first lattice constant is about 4.32 Å. The second lattice constant is about 4.538 Å. The third lattice constant is about 4.51 Å.

According to the present invention, the substrate comprises GaP. Moreover, the first buffer multilayer is represented by general formula $B_xGa_{(1-x)}P$ (where $0 \leq x \leq 1$). Furthermore, the second buffer multilayer is represented by general formula $In_yGa_{(1-y)}N$ (where $0 \leq y \leq 0.059$). Therefore, the first lattice constant is about 5.45 Å. The second lattice constant is about 4.538 Å. The third lattice constant is about 4.51 Å.

According to the present invention, the substrate comprises GaAs. Moreover, the first buffer multilayer comprises $GaAs_xP_{(1-x)}$ and $B_yGa_{(1-y)}P$ (where $0 \leq X \leq 1$, $0 \leq y \leq 1$). Furthermore, the second buffer multilayer is represented by general formula $In_zGa_{(1-z)}N$ (where $0 \leq z \leq 0.059$). Therefore, the first lattice constant is about 5.653 Å. The second lattice constant is about 4.538 Å. The third lattice constant is about 4.51 Å. The $GaAs_xP_{(1-x)}$ layer and the $B_yGa_{(1-y)}P$ layer are matched, and lattice constant of the top layer of the $GaAs_xP_{(1-x)}$ layer and that of the bottom of the $B_yGa_{(1-y)}P$ layer are the same, namely a fourth lattice constant.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

A preferred embodiment of the present invention is now described with reference to the figures.

Figure 1:
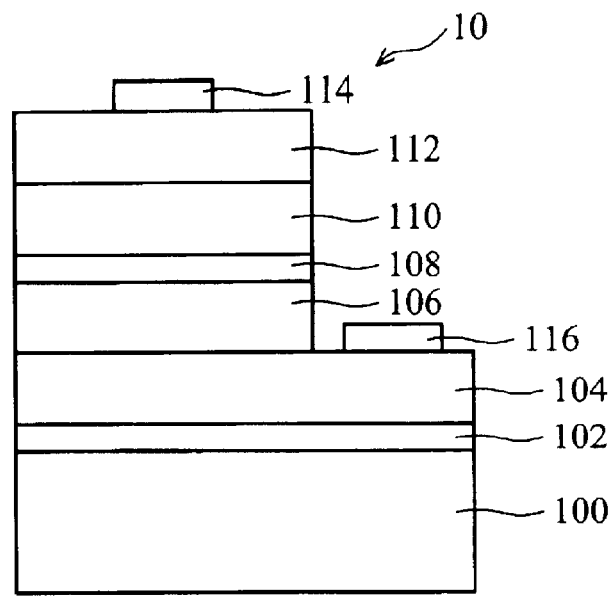
FIG. 1 is a cross-section showing a light-emitting device having a buffer layer according to prior art.
Figure 2:
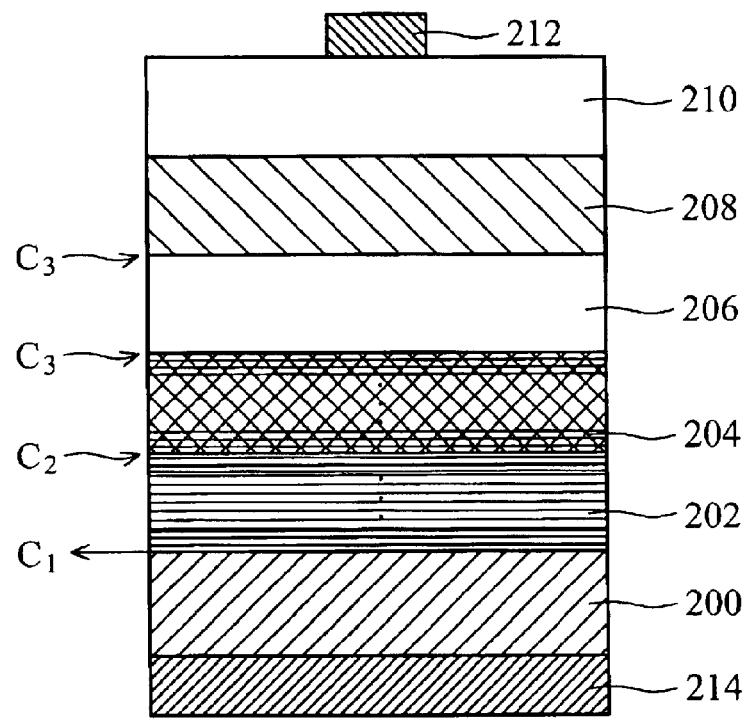
FIG. 2 is a cross-section showing a light-emitting device according to one embodiment of the present invention.

In FIG. 2, according to the present invention, a light-emitting device comprises a substrate 200, a first buffer multilayer 202 deposited on the substrate 100, a second buffer multilayer 204 deposited on the first buffer multilayer 202, and a GaN base epitaxial layer 206 deposited on the second buffer multilayer 204. The components of the first buffer multilayer 202 and the second buffer multilayer 204 can be adjusted by changing atomic ratio. The lattice constant of the first buffer multilayer 202 changes with components used.

The lattice constant of the first buffer multilayer 202 ranges from a first lattice constant $C_1$ at the bottom of the first buffer multilayer 202 to a second lattice constant $C_2$ at the top of the first buffer multilayer 202. The lattice constant of the second buffer multilayer 204 ranges from a second lattice constant $C_2$ at the bottom of the second buffer multilayer 204 to a third lattice constant $C_3$ at the top of the second buffer multilayer 204. The first cladding layer 206 has a third lattice constant $C_3$.

The lattice constant of the bottom layer of the first buffer multilayer 202, the first lattice constant C1, substantially equals the lattice constant of the substrate. The lattice constant of the first buffer multilayer 202 can increase or decrease layer by layer, enabling the lattice constant of the top layer of the first buffer multilayer 202, the second lattice constant $C_2$, to substantially equal the lattice constant of the bottom of the second buffer multilayer, the second lattice constant $C_2$.

The lattice constant of the bottom layer of the second buffer multilayer 204, the second lattice constant C2, substantially equals the lattice constant of the top layer of the first buffer multilayer 202, the second lattice constant $C_2$. The lattice constant of the second buffer multilayer 204 can increase or decrease layer by layer, enabling the lattice constant of the top layer of the second buffer multilayer, the third lattice constant $C_3$, to substantially equal the lattice constant of the first cladding layer, the third lattice constant $C_3$.

Figure 3:
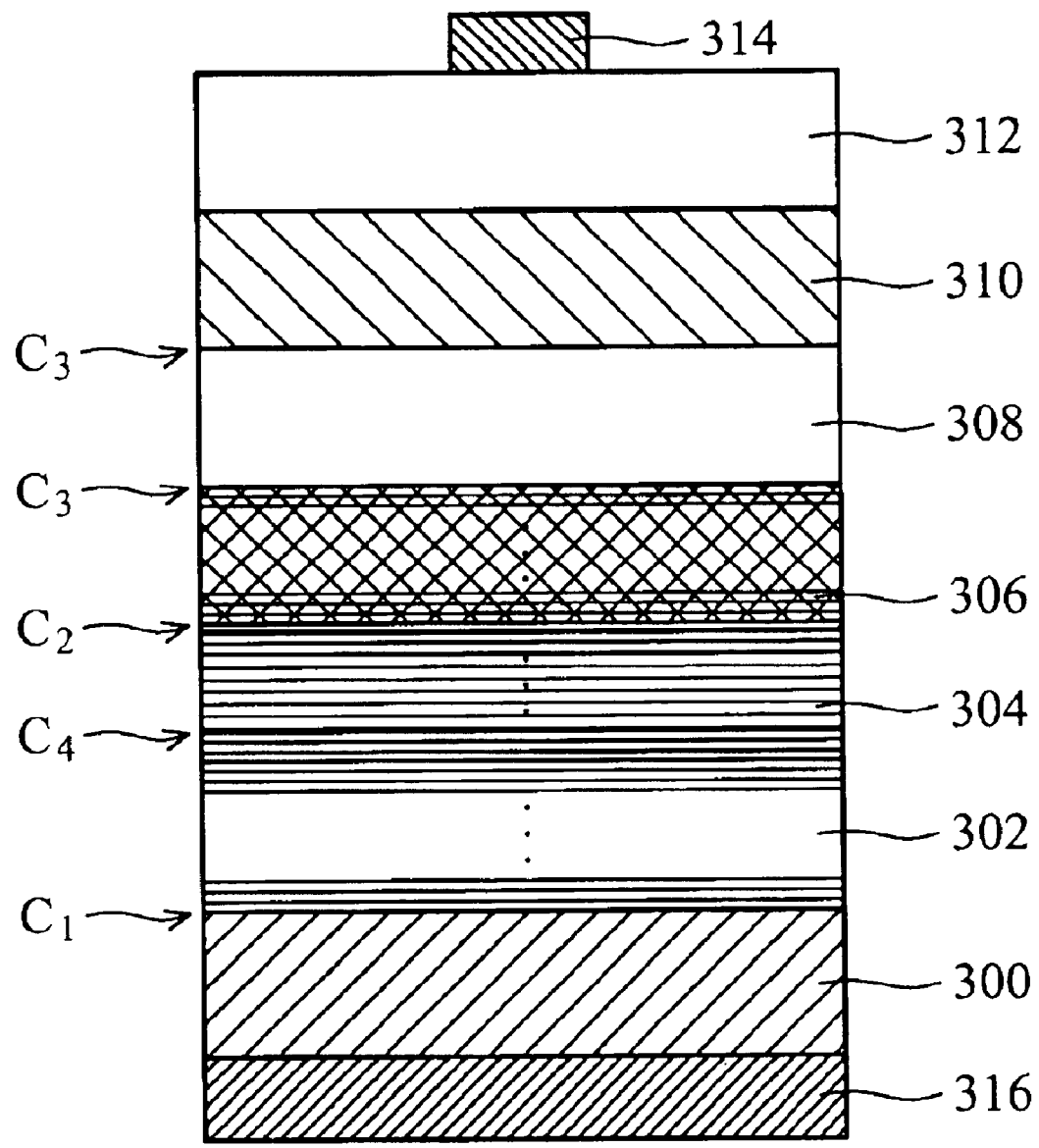
FIG. 3 is a cross-section showing a light-emitting device according to another embodiment of the present invention.

According to the present invention, the first buffer multilayer 202 can comprise one specific component of different atomic ratio, as shown in FIG. 2, or more than one specific component with different atomic ratio, as shown in FIG. 3.

First Embodiment

In this embodiment, as shown in FIG. 2, the substrate 200 comprises silicon, 3C—SiC, or GaP. The first buffer multilayer 202 is represented by general formula $B_xGa_{(1-x)}P$ (where $0.02 \leq X \leq 1$). Furthermore, the second buffer multilayer 204 is represented by general formula $In_yGa_{(1-y)}N$ (where $0 \leq y \leq 0.059$). Thus, if the substrate 200 comprises silicon, the first lattice constant $C_1$ is about 5.431 Å. If the substrate 200 comprises 3C—SiC, the first lattice constant $C_1$ is about 4.32 Å. Finally, if the substrate 200 comprises GaP, the first lattice constant $C_1$ is about 5.45 Å. In all cases in this embodiment, the second lattice constant $C_2$ is about 4.538 Å, and the third lattice constant $C_3$ is about 4.51 Å.

Second Embodiment

In this embodiment, as shown in FIG. 3, the substrate 300 comprises GaAs. Moreover, the first buffer multilayer 302, 304 comprising $GaAs_xP_{(1-x)}$ 302 and $B_yGa_{(1-y)}P$ 304 (where $0 \leq X \leq 1$, $0 \leq y \leq 1$) have two specific components of different atomic ratio. Furthermore, the second buffer multilayer 306 is represented by general formula $In_zGa_{(1-z)}N$ (where $0 \leq z \leq 0.059$). Thus, the first lattice constant $C_1$ is about 5.653 Å, the second lattice constant $C_2$ is about 4.538 Å, and the third lattice constant $C_3$ is about 4.51 Å. The $GaAs_xP_{(1-x)}$ layer and the $B_yGa_{(1-y)}P$ layer are matched, and lattice constant of the top layer of the $GaAs_xP_{(1-x)}$ layer 302 and that of the bottom of the $B_yGa_{(1-y)}P$ layer 304 are the same, namely a fourth lattice constant $C_4$.

The $B_xGa_{(1-x)}P$ first buffer multilayer 202, 302 comprising boron phosphide (BP) is preferably formed on the substrate 200 by metalorganic chemical vapor deposition (MOCVD) using precursors comprising a combination of trimethylgallium (TMG), $BCl_3$, and PCl3 or a combination of TMG, $BCl_3$, and $PH_3$. The temperature of the reactive chamber housing the substrate 200 is brought to about 900~1180° C., preferably 1030° C.

The $In_zGa_{(1-z)}N$ second buffer multilayer 204, 306 is preferably formed on the substrate 200 by metalorganic chemical vapor deposition (MOCVD) using precursors comprising a combination of trimethyaluminum (TMAl), trimethyindium (TMIn), trimethylgallium (TMG), and $NH_3$.

The GaN cladding layer 206, 308 formation is described herein as an example.

First, hydrogen, nitrogen and MMH are introduced into the chamber housing the substrate 200, 300 at about 350~500° C. After 3 minutes, TMG is introduced into the chamber for about 20 minutes. 5 minutes later, the temperature of the chamber is brought to about 820° C. TMG is introduced into the chamber again for 60 minutes at about 820° C. Throughout the entire process, MMH is continuously introduced. Finally, the temperature of the chamber is maintained at about 820° C. for 30 minutes after stopping to introduce MMH and TMG. After decreasing the temperature of the chamber to room temperature, the process of forming the GaN epitaxial layer 206, 308 is accomplished.

According to the present invention, the light-emitting device further comprises an active layer 208, 310 deposited on the first cladding layer 206, 308, with a second cladding layer 210, 312 deposited on the active layer 208 and comprising a GaN-based semiconductor material.

The active layer 208, 310, consisting of a GaN-based semiconductor material, such as $In_yGa_{(1-y)}N$, is preferably formed by MOCVD using precursors comprising a combination of trimethyaluminum (TMAl), trimethyindium (TMIn), trimethylgallium (TMG), and $NH_3$. The component ratio can be adjusted by changing atomic ratio.

The light-emitting device further comprises a window layer and a pair of electrodes. A surface ohmic electrode can be provided on the surface of the second cladding layer 210, 312 serving as a contact layer. In a p-type contact layer, the surface ohmic electrode can be composed of a zinc(Zn)-containing alloy, such as indium zinic (InZn) and a gold beryllium (AuBe) alloy. These metals form a good ohmic contact with the second cladding layer 210, 312. For the pad electrode, a metal having low electric resistance, such as gold (Au) or aluminum (Al), is preferably used. The surface ohmic electrode disposed in the periphery of the pad electrode on the surface of the second cladding layer 210, 312 allows the device operating current supplied through a window layer from the pad electrode thereon to diffuse over a wide area of the light-emitting layer. The first type electrode 214, 316 is deposited on the back of the substrate 200, 300, and a second type electrode 212, 314 is deposited on the second cladding 210, 312. The substrate 200, 300 can be doped to equalize the conductivities of the substrate and the first type electrode 214, 316. The second cladding layer 210, 312 can be doped to equalize the conductivities of the substrate and the second type electrode 212, 314.

Moreover, the light-emitting device of the present invention can further comprise a reflective multilayer (not shown) deposited between the second buffer multilayer 204, 306 and the first cladding layer 206, 308. The reflective multilayer consists of a repeatedly stacked GaN/AlxGa1−xN (where 0.1<x<0.5) with a super lattice is preferably formed by MOCVD. A pair of GaN/AlxGa1−xN is repeated for 30~50 pairs. The thickness of a single layer of GaN or AlxGa1−xN is about 800~1600 Å. The reflective multilayer with 95~99.99% reflection can serve as a distributed Bragg reflector (DBR) to enhance light efficiency.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting device with reduced lattice mismatch, comprising:

a substrate having a first lattice constant;

a first buffer multilayer deposited on said substrate, wherein the lattice constant of said first buffer multilayer ranges from said first lattice constant at the bottom of said first buffer multilayer to a second lattice constant at the top of said first buffer multilayer;

a second buffer multilayer deposited on said first buffer multilayer, wherein the lattice constant of said second buffer multilayer ranges from said second lattice constant at the bottom of said second buffer multilayer to a third lattice constant at the top of said second buffer multilayer; and a GaN-based epitaxial layer deposited on the surface of said second buffer multilayer with said third lattice constant.

2. The device as claimed in claim 1, wherein said substrate comprises silicon, said first buffer multilayer is represented by general formula $B_xGa_{(1-x)}P$ (where $0.002 \leq X \leq 1$), and said second buffer multilayer is represented by general formula $In_yGa_{(1-y)}N$ (where $0 \leq y \leq 0.0059$).

3. The device as claimed in claim 1, wherein said substrate comprises GaP, said first buffer multilayer is represented by general formula $B_xGa_{(1-x)}P$ (where $0 \leq X \leq 1$), and said second buffer multilayer is represented by general formula $In_yGa_{(1-y)}N$ (where $0 \leq y \leq 0.059$).

4. The device as claimed in claim 1, wherein said substrate comprises GaAs, said first buffer multilayer comprises $GaAs_xP_{(1-x)}$ and $B_yGa_{(1-y)}P$ (where $0 \leq X \leq 1$, $0 \leq y \leq 1$), and said second buffer multilayer is represented by general formula $In_zGa_{(1-z)}N$ (where $0 \leq z \leq 0.059$).

5. A light-emitting device with reduced lattice mismatch, comprising:

a silicon substrate having a first lattice constant;

a $B_xGa_{(1-x)}P$ buffer layer (where $0.02 \leq X \leq 1$) deposited on said silicon substrate, wherein the lattice constant of said $B_xGa_{(1-x)}P$ buffer layer ranges from said first lattice constant at the bottom of said $B_xGa_{(1-x)}P$ buffer layer to a second lattice constant at the top of said $B_xGa_{(1-x)}P$ buffer layer;

a $In_yGa_{(1-y)}N$ buffer layer (where $0 \leq y \leq 0.059$) deposited on said $B_xGa_{(1-x)}P$ buffer layer, wherein the lattice constant of the $In_yGa_{(1-y)}N$ buffer layer ranges from said second lattice constant at the bottom of said $In_yGa_{(1-y)}N$ buffer layer to a third lattice constant at the top of said $In_yGa_{(1-y)}N$ buffer layer; and a GaN-based epitaxial layer deposited on the $In_yGa_{(1-y)}N$ buffer layer with said third lattice constant.

6. A light-emitting device with reduced lattice mismatch, comprising:

a 3C—SiC substrate having a first lattice constant;

a $B_xGa_{(1-x)}P$ buffer layer (where $0.02 \leq X \leq 1$) deposited on said 3C—SiC substrate, wherein the lattice constant of said $B_xGa_{(1-x)}P$ buffer layer ranges from said first lattice constant at the bottom of said $B_xGa_{(1-x)}P$ buffer layer to a second lattice constant at the top of said $B_xGa_{(1-x)}P$ buffer layer;

a $In_yGa_{(1-y)}N$ buffer layer (where $0 \leq y \leq 0.059$) deposited on said $B_xGa_{(1-x)}P$ buffer layer, wherein the lattice constant of said $In_yGa_{(1-y)}N$ buffer layer ranges from said second lattice constant at the bottom of said $In_yGa_{(1-y)}N$ buffer layer to a third lattice constant at the top of said $In_yGa_{(1-y)}N$ buffer layer; and a GaN-based epitaxial layer deposited on the $In_yGa_{(1-y)}N$ buffer layer with third lattice constant.

7. A light-emitting device with reduced lattice mismatch, comprising:

a GaAs substrate having a first lattice constant;

a $GaAs_xP_{(1-x)}$ buffer layer (where $0 \leq X \leq 1$) deposited on said GaAs substrate, wherein the lattice constant of said $GaAs_xP_{(1-x)}$ buffer layer ranges from said first lattice constant at the bottom of said $GaAs_xP_{(1-x)}$ buffer layer to a second lattice constant at the top of said $GaAs_xP_{(1-x)}$ buffer layer;

a $B_yGa_{(1-y)}P$ buffer layer (where $0 \leq y \leq 1$) deposited on said $GaAs_xP_{(1-x)}$ buffer layer, wherein the lattice constant of said $B_xGa_{(1-y)}P$ buffer layer ranges from said second lattice constant at the bottom of said $B_xGa_{(1-y)}P$ buffer layer to a third lattice constant at the top of said $B_yGa_{(1-y)}P$ buffer layer;

a $In_zGa_{(1-z)}N$ (where $0 \leq z \leq 0.059$) buffer layer deposited on said $B_yGa_{(1-y)}P$ buffer layer, wherein the lattice constant of said $In_zGa_{(1-z)}N$ buffer layer ranges from said third lattice constant at the bottom of said $In_zGa_{(1-z)}N$ buffer layer to a fourth lattice constant at the top of said $In_yGa_{(1-y)}N$ buffer layer; and a GaN-based epitaxial layer deposited on said $In_zGa_{(1-z)}N$ buffer layer with said fourth lattice constant.

8. A light-emitting device with reduced lattice mismatch, comprising:

a GaP substrate having a first lattice constant;

a $B_xGa_{(1-x)}P$ buffer layer (where $0 \leq X \leq 1$) deposited on said GaP substrate, wherein the lattice constant of said $B_xGa_{(1-x)}P$ buffer layer ranges from said first lattice constant at the bottom of said $B_xGa_{(1-x)}P$ buffer layer to a second lattice constant at the top of said $B_xGa_{(1-x)}P$ buffer layer;

a $In_yGa_{(1-y)}N$ buffer layer (where $0 \leq y \leq 0.059$) deposited on said $B_xGa_{(1-x)}P$ buffer layer, wherein the lattice constant of said $In_yGa_{(1-y)}N$ buffer layer ranges from said second lattice constant at the bottom of said $In_yGa_{(1-y)}N$ buffer layer to a third lattice constant at the top of said $In_yGa_{(1-y)}N$ buffer layer; and a GaN-based epitaxial layer deposited on said $In_yGa_{(1-y)}N$ buffer layer with said third lattice constant.

9. A light-emitting device with reduced lattice mismatch, comprising:

a 3C—SiC substrate having a first lattice constant;

a $B_xGa_{(1-x)}P$ buffer layer (where $X=1$) deposited on said 3C—SiC substrate, wherein the lattice constant of said $B_xGa_{(1-x)}P$ buffer layer has a first lattice constant;

a $In_yGa_{(1-y)}N$ buffer layer (where $0 \leq y \leq 0.059$) deposited on said $B_xGa_{(1-x)}P$ buffer layer, wherein the lattice constant of said $In_yGa_{(1-y)}N$ buffer layer ranges from said first lattice constant at the bottom of said $In_yGa_{(1-y)}N$ buffer layer to a second lattice constant at the top of said $In_yGa_{(1-y)}N$ buffer layer; and a GaN-based epitaxial layer deposited on the $In_yGa_{(1-y)}N$ buffer layer with second lattice constant.

* * * * *